United States Patent [19]

Tanigawa et al.

[11] Patent Number: 5,216,375
[45] Date of Patent: Jun. 1, 1993

[54] VARIABLE TIME-CONSTANT TYPE DIFFERENTIATOR

[75] Inventors: Hiroshi Tanigawa, Tsugashima; Hiroshi Kondou, Tsurugashima; Tsuneo Tohyama, Tsurugashima; Isao Fukai, Tsurugashima, all of Japan

[73] Assignee: Toko, Inc., Tokyo, Japan

[21] Appl. No.: 764,912

[22] Filed: Sep. 24, 1991

[30] Foreign Application Priority Data

Oct. 11, 1990 [JP] Japan .................................. 2-272825

[51] Int. Cl.5 .............................................. H03K 5/00
[52] U.S. Cl. .................................. 328/127; 328/142; 307/490; 307/493; 307/494
[58] Field of Search ............. 307/490, 491, 493, 494; 328/127, 128, 142

[56] References Cited

U.S. PATENT DOCUMENTS

| | | | |
|---|---|---|---|
| 3,581,215 | 5/1971 | Meyer | 307/491 |
| 3,621,407 | 11/1971 | Low | 307/490 |
| 3,633,044 | 1/1972 | Buckstad | 307/494 |
| 3,792,367 | 2/1974 | Fleischer et al. | 330/98 |
| 3,969,682 | 7/1976 | Rossum | 330/306 |
| 4,013,975 | 3/1977 | Kataoka et al. | 328/172 |
| 4,071,777 | 1/1978 | Herrmann | 307/494 |
| 4,354,162 | 10/1982 | Wright | 330/294 |
| 4,374,335 | 2/1983 | Fukahori et al. | 328/127 |
| 4,506,174 | 3/1985 | Hitt | 307/491 |

OTHER PUBLICATIONS

Millman et al., "Pulse, Digital, and Switching Waveforms", 1965, pp. 15-18, 28 and 38-50.

*Primary Examiner*—William L. Sikes
*Assistant Examiner*—Terry D. Cunningham

[57] ABSTRACT

A variable time-constant differentiator comprises an operational amplifier t which a signal is inputted through a capacitor; and a variable transconductance amplifier connected between an input terminal to which a signal is applied and an 5 output terminal.

3 Claims, 3 Drawing Sheets

FIG.5
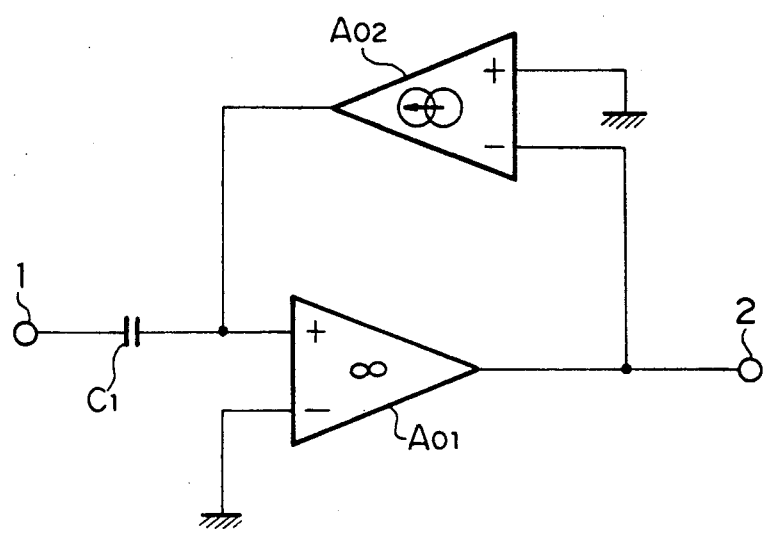
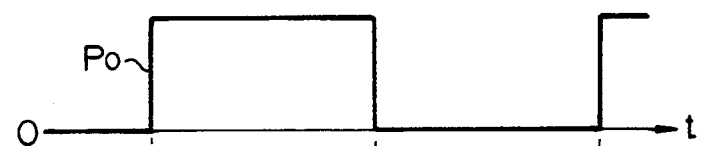
FIG.6(A)
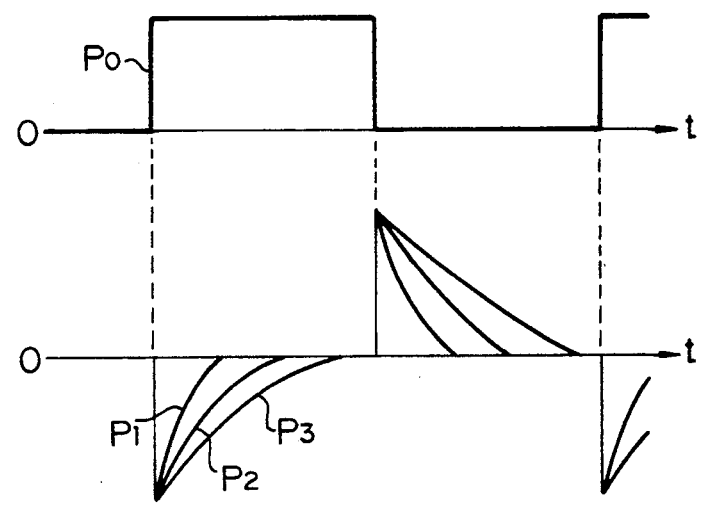
FIG.6(B)

VARIABLE TIME-CONSTANT TYPE DIFFERENTIATOR

BACKGROUND OF THE INVENTION

1. Field of the Invention

The present inventions relates to a variable time-constant type differentiator adapted for use with an active filter circuit comprising multistage-connected operational amplifiers or the like.

2. Description of the Prior Art

Referring to FIG. 1 of the accompanying drawings, a conventional differentiator is illustrated wherein a resistor $R_o$ is connected across the input and output terminals of an operational amplifier $A_o$ to which a signal is inputted through a capacitor $C_o$. To achieve a variable time-constant type differentiator, it is required that the resistor Ro be a variable resistor. However, when it is attempted to construct, by using such differentiators, a filter circuit in the form of a semiconductor integrated circuit which is connected in multistage configuration like an active filter, especially a low pass filter, it is demanded that external resistors or the like be eliminated to a maximum possible extent to achieve one-chip construction and miniaturization of the circuit.

The foregoing conventional differentiator comprises a resistor, a capacitor and an operational amplifier. Thus, to provide such a differentiator as a variable time-constant type one, an external variable resistor must be employed. Obviously, however, this is undesirable for formation of a semiconductor integrated circuit.

A differentiator in the form of a semiconductor integrated circuit using a function unit has also been proposed; however, such a differentiator is disadvantageous in that the circuit construction is highly complicated and difficulties are encountered in an attempt to achieve miniaturization.

SUMMARY OF THE INVENTION

Accordingly, it is a primary object of the present invention to provide a variable time-constant type differentiator which can readily be provided in the form of a semiconductor integrated circuit and can be miniaturized even with multistage-connection of such differentiators.

Briefly, the variable time-constant differentiator according to the present invention comprises an operational amplifier to which a signal is inputted through a capacitor; and a variable transconductance amplifier, and connected between one of the input terminals and the output terminals of the operational amplifier.

With the variable time-constant differentiator of this invention, the time constant thereof is variable by using, in lieu of a variable resistor, a variable transconductance amplifier, or more specifically a variable-transconductance type differential input transconductance amplifier.

As will be appreciated, the variable time-constant type differentiator according to the present invention is advantageous in that it can be constructed in a highly simplified circuit arrangement and the time-constant thereof can readily be adjusted by the fact that the transconductance of the transconductance amplifier can readily be varied simply by adjusting the operating current of the transconductance amplifier. Another important advantage is that the differentiator of the present invention can readily be constructed in the form of a semiconductor integrated circuit by virtue of the fact that the differentiator comprises an operational amplifier and a transconductance amplifier.

As will also be appreciated, by using the variable time-constant differentiator of this invention, it is possible to reduce the size of an active filter even when the latter is constructed in multistage connection. Thus, the variable time-constant differentiator of this invention is most efficiently applicable in an attempt to construct a low pass filter, band pass filter or the like which is of multistage connection.

Other objects, features and advantages of the present invention will become apparent from the ensuing description taken in conjunction with the accompanying drawings.

BRIEF DESCRIPTION OF THE DRAWINGS

FIG. 5 is a circuit diagram illustrating the variable time-constant type differentiator according to a second embodiment of the present invention.

FIGS. 6(A) and 6(B) illustrate operating waveforms which occur in the differentiator according to the present invention.

DESCRIPTION OF THE PREFERRED EMBODIMENTS

Figure 2:
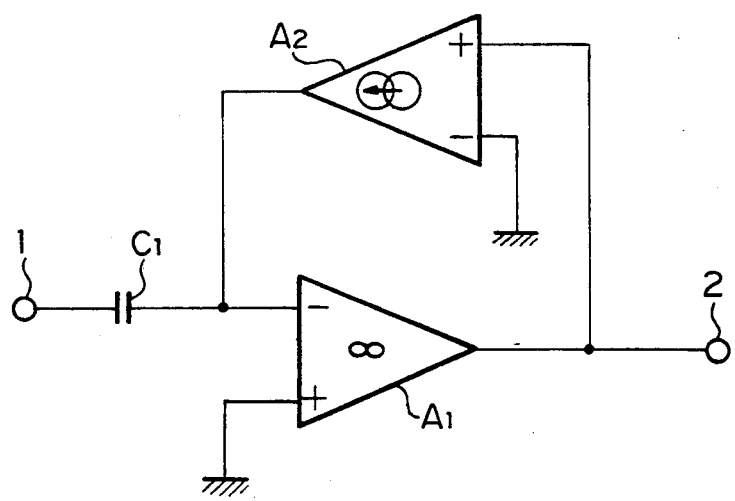
FIG. 2 is a circuit diagram illustrating the variable time-constant type differentiator according to a first embodiment of the present invention.

Referring to FIG. 2, there is shown a circuit diagram illustrating an example of the variable time-constant differentiator embodying the present invention.

In FIG. 2, a capacitor $C_1$ is connected at one end to an input terminal 1 and at the opposite end to an inverting input terminal of an operational amplifier $A_1$, a non-inverting terminal of which is grounded. The output terminal of the operational amplifier $A_1$ is connected to a non-inverting input terminal of a transconductance amplifier $A_2$ having the output terminal thereof connected to the inverting input terminal of the operational amplifier $A_1$. A non-inverting terminal of the transconductance amplifier $A_2$ is grounded. The transconductance amplifier serves as a negative feedback circuit. Indicated at 2 is an output terminal from which a differentiation output is derived.

Figure 1:
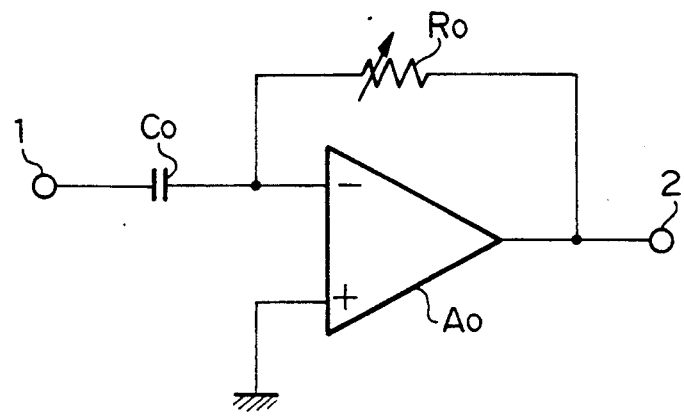
FIG. 1 is a circuit diagram of an example of conventional differentiator.
Figure 3:
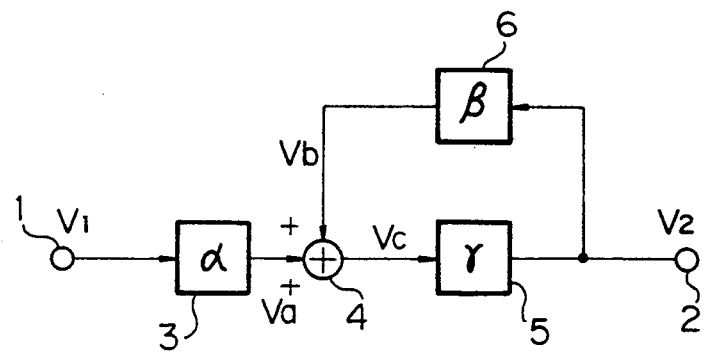
FIG. 3 is a block diagram useful for explaining the conventional differentiator.
Figure 4:
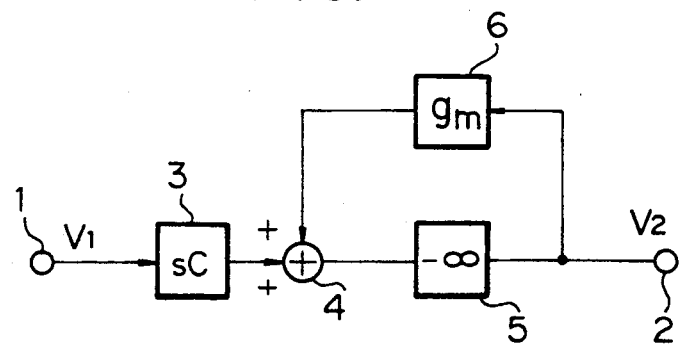
FIG. 4 is a block diagram useful for explaining the variable time-constant type differentiator according to the present invention.

The transfer function of the conventional differentiator shown in FIG. 1 is illustrated in the block diagram of FIG. 3. With reference to FIGS. 3 and 4, description will be made of the differentiator according to the present invention.

The transfer function of the differentiator will be sought on the basis of the block diagram of FIG. 3, and the differentiator of the present invention will be described.

Let it be assumed that an input voltage applied to the input terminal 1 is $V_1$; the output voltage of a block 3 in FIG. 3 is $V_3$; the output voltage of a block 6 is $V_b$; the output voltage of an adder 4 is $V_o$; the output voltage derived from the output terminal 2 is $V_2$; and the variables of the blocks 3, 5 and 6 are $\alpha$, $\gamma$ and $\beta$ respectively.

Then, the relationship between the input and output voltages of these blocks are given as follows:

$$V_a = \alpha V_1 \quad (1)$$

$$V_b = \beta V_2 \quad (2)$$

$$V_c = V_a + V_b \quad (3)$$

$$V_2 = \gamma V_c \quad (4)$$

The transfer function $V_2/V_1$ of the block diagram of FIG. 3 is sought from equations (1) to (4) as follows:

$$v_2/v_1 = \alpha/(1/\gamma - \beta) \quad (5)$$

Assuming that the transfer function $V_2/V_1$ of the differentiator the time constant of which is variable, is $-sC/gm$, equation (5) can be rewritten as follows:

$$\alpha/(1/\gamma - \beta) = -sC/gm \quad (6)$$

In order that equation (6) may hold true, it is required that the following relationship be established among the respective variables: $\alpha = sC$, $\beta = gm$, $1/\gamma = 0$ (where $\gamma = -\infty$). The establishment of such relationship results in a variable time-constant differentiator being achieved.

This means that it is possible to construct a variable time-constant differentiator by realizing such a block diagram shown in FIG. 4.

From the block diagram of FIG. 4, it will be seen that the variable sC of the block 3 may be substituted with a capacitor $C_1$; the block 5 may be replaced with an operational amplifier $A_1$ having a gain of about $-\infty$; and the variable gm of the block 6 can be realized by a transconductance amplifier $A_2$ the transconductance of which is variable. If the differentiator is current-operated, then adder 4 may be achieved simply by connecting the differentiator to a portion where addition is to be effected.

FIG. 6 illustrates input and output waveforms of the variable time-constant differentiator embodying the present invention, the time-constant of which is defined by the value for the capacitor $C_1$ and the transconductance of the variable transconductance amplifier $A_2$. Thus, the time-constant of the differentiator can be varied by changing the transconductance of the variable transconductance amplifier $A_2$. The variable transconductance amplifier $A_2$ may be of the well-known type.

FIG. 6(A) illustrates an input pulse waveform, and FIG. 6(B) shows an output pulse waveform from which it is seen that as the transconductance of the transconductance amplifier is increased, there occurs a differentiation waveform with a higher time constant $\gamma$ as indicated by $P_1$, $P_2$, $P_3$.

Referring to FIG. 5, there is shown the variable time-constant type differentiator according to a second embodiment of the present invention, which uses a non-inverting type operational amplifier $A_{01}$ in place of the inverting type operational amplifier $A_1$ of the embodiment shown in FIG. 2.

In this embodiment, a capacitor C1 is connected at one end thereof to an input terminal and at the other end to the non-inverting input terminal of the operational amplifier $A_{01}$ having the inverting terminal thereof grounded. The output terminal of the operational amplifier $A_{01}$ is connected to the inverting input terminal of the mutual conductance amplifier $A_{02}$, the output terminal of which is connected to the non-inverting input terminal of the operational amplifier $A_{01}$. Such an arrangement provides a differentiation output waveform corresponding to reversal of that provided by the differentiator of FIG. 2.

While the present invention has been illustrated and described with respect to specific embodiments thereof, it is to be understood that this invention is by no means limited thereto but encompasses all changes and modifications which will become possible without departing from the scope of the appended claims.

We claim:

1. A variable time-constant type differentiator comprising:
   a capacitor;
   an operational amplifier having differential input terminals in which an input signal is supplied to one of the input terminals via said capacitor another of the input terminals being directly connected to ground, said operational amplifier having a single output terminal; and
   a variable transconductance amplifier connected between the one input terminal and the output terminal of said operational amplifier, wherein the time-constant of said differentiator is formed by the combination of said capacitor and the transconductance of said variable transconductance amplifier.

2. A variable time-constant type differentiator, comprising:
   an operational amplifier having a first and second input terminal and an output terminal, wherein a signal is supplied to said first input terminal through a capacitor, said second input terminal being grounded; and
   a variable transconductance amplifier having a first and second input terminal, and an output terminal, wherein said output terminal and said first input terminal of said variable transconductance amplifier are connected to said first input terminal and said output terminal of said operational amplifier, respectively, said second input terminal of said variable transconductance amplifier being grounded, wherein said first input terminal of said operational amplifier is an inverting terminal, said second input terminal of said operational amplifier being a non-inverting; and said first input terminal of said variable transconductance amplifier is a non-inverting terminal, said second input terminal of said variable transconductance amplifier being an inverting terminal.

3. A variable time-constant type differentiator, comprising
   an operational amplifier having a first and second input terminal and an output terminal, wherein a signal is supplied to said first input terminal through a capacitor, said second input terminal being grounded; and
   a variable transconductance amplifier having a first and second input terminal, and an output terminal, wherein said output terminal and said first input terminal of said variable transconductance amplifier are connected to said first input terminal and said output terminal of said operational amplifier, respectively, said second input terminal of said variable transconductance amplifier being grounded, wherein said first input terminal of said operational amplifier is an non-inverting terminal, said second input terminal of said operational amplifier being a inverting terminal; and said first input terminal of said variable transconductance amplifier is a inverting terminal, said second input terminal of said variable transconductance amplifier being an non-inverting terminal.

* * * * *